(12) United States Patent
Chen et al.

(10) Patent No.: US 11,031,372 B2
(45) Date of Patent: Jun. 8, 2021

(54) SEMICONDUCTOR DEVICE INCLUDING DUMMY PULL-DOWN WIRE BONDS

(71) Applicant: WESTERN DIGITAL TECHNOLOGIES, INC., San Jose, CA (US)

(72) Inventors: Han-Shiao Chen, Taichung (TW); Chih-Chin Liao, Changhua (TW); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 36 days.

(21) Appl. No.: 16/398,511

(22) Filed: Apr. 30, 2019

(65) Prior Publication Data

US 2019/0341366 A1 Nov. 7, 2019

(30) Foreign Application Priority Data

May 4, 2018 (CN) .......................... 201810418341.9

(51) Int. Cl.
*H01L 25/065* (2006.01)
*H01L 23/00* (2006.01)

(52) U.S. Cl.
CPC .......... *H01L 25/0652* (2013.01); *H01L 24/46* (2013.01); *H01L 24/48* (2013.01); *H01L 24/49* (2013.01); *H01L 25/0657* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC ......... H01L 24/45; H01L 24/46; H01L 24/48; H01L 24/49; H01L 25/0562; H01L 25/0657; H01L 2225/06503; H01L 2225/0651; H01L 2225/06506; H01L 2225/06562; H01L 2225/06586
USPC .......................... 257/686, 726, 727, 777, 784
See application file for complete search history.

(56) References Cited

U.S. PATENT DOCUMENTS

| 6,316,838 | B1 | 11/2001 | Ozawa et al. | |
|---|---|---|---|---|
| 7,723,836 | B2 | 5/2010 | Kwon et al. | |
| 8,796,074 | B2* | 8/2014 | Muto | H01L 24/29 438/107 |
| 2012/0038035 | A1 | 2/2012 | Chang et al. | |
| 2013/0200530 | A1* | 8/2013 | Song | H01L 24/48 257/777 |
| 2015/0043285 | A1* | 2/2015 | Min | H01L 21/6734 365/189.02 |
| 2015/0194410 | A1* | 7/2015 | Nam | H01L 25/0657 257/701 |
| 2018/0005974 | A1* | 1/2018 | Chiu | H01L 23/5384 |

(Continued)

FOREIGN PATENT DOCUMENTS

| CN | 1466213 A | 1/2004 |
|---|---|---|
| CN | 101150120 A | 3/2008 |

(Continued)

*Primary Examiner* — Matthew E Warren
(74) *Attorney, Agent, or Firm* — Vierra Magen Marcus LLP

(57) ABSTRACT

A semiconductor device is disclosed including a stack of semiconductor die on a substrate, wherein a semiconductor die in the stack is wire bonded to the substrate using dummy wire bonds. Each dummy wire bond has a stiffness so that together, the dummy wire bonds effectively pull and/or hold down the die stack against the substrate.

24 Claims, 10 Drawing Sheets

(56) References Cited

U.S. PATENT DOCUMENTS

| | | | |
|---|---|---|---|
| 2019/0035705 A1* | 1/2019 | Mao | H01L 24/32 |
| 2019/0051527 A1* | 2/2019 | Lin | G03F 1/00 |

FOREIGN PATENT DOCUMENTS

| | | |
|---|---|---|
| CN | 102044533 A | 5/2011 |
| CN | 102136467 A | 7/2011 |
| CN | 102629604 A | 8/2012 |
| CN | 102959700 A | 3/2013 |
| CN | 103208432 A | 7/2013 |
| CN | 104795386 A | 7/2015 |
| CN | 106206335 A | 12/2016 |
| JP | 2007165454 A | 6/2007 |
| JP | 2008085032 A | 4/2008 |
| JP | 2009194189 A | 8/2009 |
| KR | 100680954 B1 | 2/2007 |
| KR | 101781799 B1 | 9/2017 |
| TW | 201714265 A | 4/2017 |

* cited by examiner

SEMICONDUCTOR DEVICE INCLUDING DUMMY PULL-DOWN WIRE BONDS

FIELD OF THE INVENTION

The present technology generally relates to a semiconductor device, and in particular to a semiconductor device including dummy pull-down wire bonds.

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor die on top of each other. In order to provide access to bond pads on the semiconductor die, the die are stacked, either completely overlapping each other with a spacer layer in between adjacent die, or with an offset. In an offset configuration, a die is stacked on top of another die so that the bond pads of the lower die are left exposed.

It is a problem with conventional stacked die that the die tend to warp or tilt upward at the non-wire bonded side. Prior art FIG. 1 show an example of a conventional semiconductor package 50 including stacked memory die 52 which have tilted upward off the substrate 54 at the non-wire bonded side. In some instances, the die may tilt to the point where an edge of the top die extends through a surface of the encapsulating molding compound 56, where it is then exposed to the external environment. Additionally, package manufacturers print a package name, specifications, logo and/or other information on the package surface. Given the known protrusion of the die edge, the area where the die edge protrudes may be designated as a keep out area, where nothing is printed. This limits a manufacturer's ability to print on the package surface.

SUMMARY

In one example, the present technology relates to a semiconductor device, comprising: a substrate including a set of contact pads; one or more semiconductor die mounted on the substrate and electrically coupled to the substrate, at least one semiconductor die of the one or more semiconductor die comprising a set of bond pads; a set of wire bonds connected between the set of bond pads on the at least one semiconductor die and the set of contact pads on the substrate, the set of wire bonds configured to exert a force on the one or more semiconductor die to hold the one or more semiconductor die down on the substrate.

In another example, the present technology relates to a semiconductor device, comprising: a substrate including a first set of contact pads and a second set of contact pads; one or more semiconductor die mounted on the substrate, at least one semiconductor die of the one or more semiconductor die comprising a first set of bond pads and a second set of bond pads; a first set of wire bonds electrically connecting the first set of bond pads on the at least one semiconductor die to the first set of contact pads on the substrate, the first set of wire bonds configured to transfer signals between the first set of bond pads and the first set of contact pads; and a second set of wire bonds connected between the second set of bond pads on the at least one semiconductor die and the second set of contact pads on the substrate, the second set of wire bonds configured to exert a force on the one or more semiconductor die to hold the one or more semiconductor die down on the substrate.

In a further example, the present technology relates to a semiconductor device, comprising: a substrate including a first set of contact pads and a second set of contact pads; a plurality of semiconductor die stacked on the substrate in an offset stepped arrangement; a component mounted on top of the plurality of semiconductor die; a set of dummy bond pads formed along an edge of the component; a set of signal transfer wire bonds configured to electrically connect the plurality of semiconductor die with each other and the first set of contact pads on the substrate; and a set of dummy wire bonds connected between the set of dummy bond pads and the second set of contact pads on the substrate, the set of dummy wire bonds configured to exert a force on the plurality of semiconductor die to hold the plurality of semiconductor die down on the substrate.

In a further example, the present technology relates to a semiconductor device, comprising: substrate means including a set of contact pads means; one or more semiconductor die mounted on the substrate means, the one or more semiconductor die comprising first and second opposed edges; means, off the first edge, for electrically coupling the one or more semiconductor die to the substrate means; means for exerting a force on the second edge to hold the one or more semiconductor die down on the substrate.

DETAILED DESCRIPTION

Figure 1:
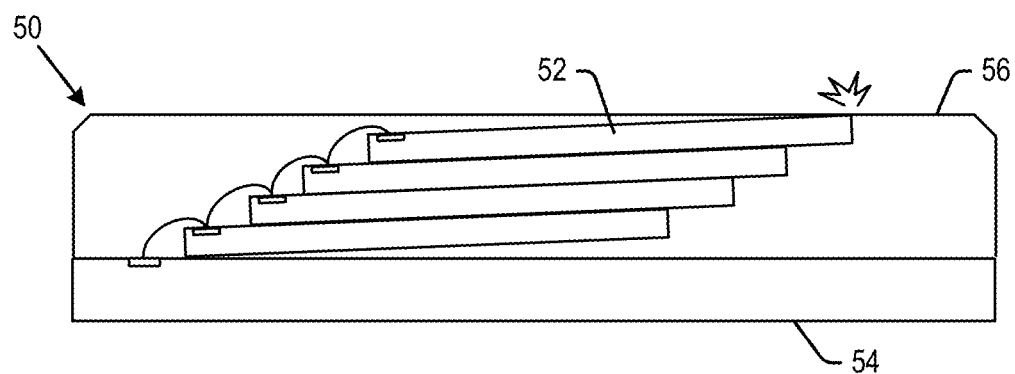
FIG. 1 is a prior art view of a semiconductor package with a tilted die stack.

The present technology will now be described with reference to the figures, which in embodiments, relate to a semiconductor device including dummy wire bonds to secure a die stack flat against a substrate. In embodiments, the die stack may include a number of semiconductor die stacked in an offset, stepped configuration. A first edge of the die in the die stack include die bond pads that receive wire bonds down the stack to electrically interconnect the die in the stack with each other and the substrate.

In accordance with aspects of the present technology, a top semiconductor die in the die stack may include two sets of die bond pads. A first set of die bond pads may be disposed along the first edge of the die, and may be used as part of the electrically interconnected die bond pads on the first edge of the die stack to transfer signals to and from the top semiconductor die. A second set of die bond pads, disposed along a second, opposed edge, may be a "dummy" set of die bond pads, in that they are not used to transfer signals to and/or from the top semiconductor die.

The second, or dummy, set of die bond pads are wire bonded to the substrate using dummy wire bonds off a second edge of the die stack. The wire bonds off the second edge of the die stack may be a "dummy" set of wire bonds, in that they are not used to transfer signals to and/or from the top semiconductor die. Each dummy wire bond has a stiffness so that together, the dummy wire bonds effectively pull and/or hold down the die stack against the substrate.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%. As used herein the term "semiconductor die" or simply "die" may refer to one or more semiconductor die.

An embodiment of the present technology will now be explained with reference to the flowchart of FIG. 2 and the top, side and perspective views of FIGS. 4 through 16. Although FIGS. 3 through 16 each show an individual semiconductor device 100, or a portion thereof, it is understood that the semiconductor device 100 may be batch processed along with a plurality of other packages on substrate panels to achieve economies of scale. The number of rows and columns of devices 100 on the substrate panels may vary.

The substrate panel for the fabrication of semiconductor device 100 begins with a plurality of substrates 102 (again, one such substrate is shown in FIGS. 2 through 18). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as shown in FIG. 3. The core 103 may be formed of various dielectric materials such as for example, polyimide laminates, epoxy resins including FR4 and FR5, bismaleimide triazine (BT), and the like. The core may have a thickness of between 40 microns (μm) to 200 μm, although the thickness of the core may vary outside of that range in alternative embodiments. The core 103 may be ceramic in alternative embodiments.

The conductive layers 105, 107 surrounding the core may be formed of copper or copper alloys, plated copper or plated copper alloys, Alloy 42 (42Fe/58Ni), copper plated steel, or other metals and materials suitable for use on substrate panels. The conductive layers may have a thickness of about 10 μm to 25 μm, although the thickness of the layers may vary outside of that range in alternative embodiments.

Figure 2:
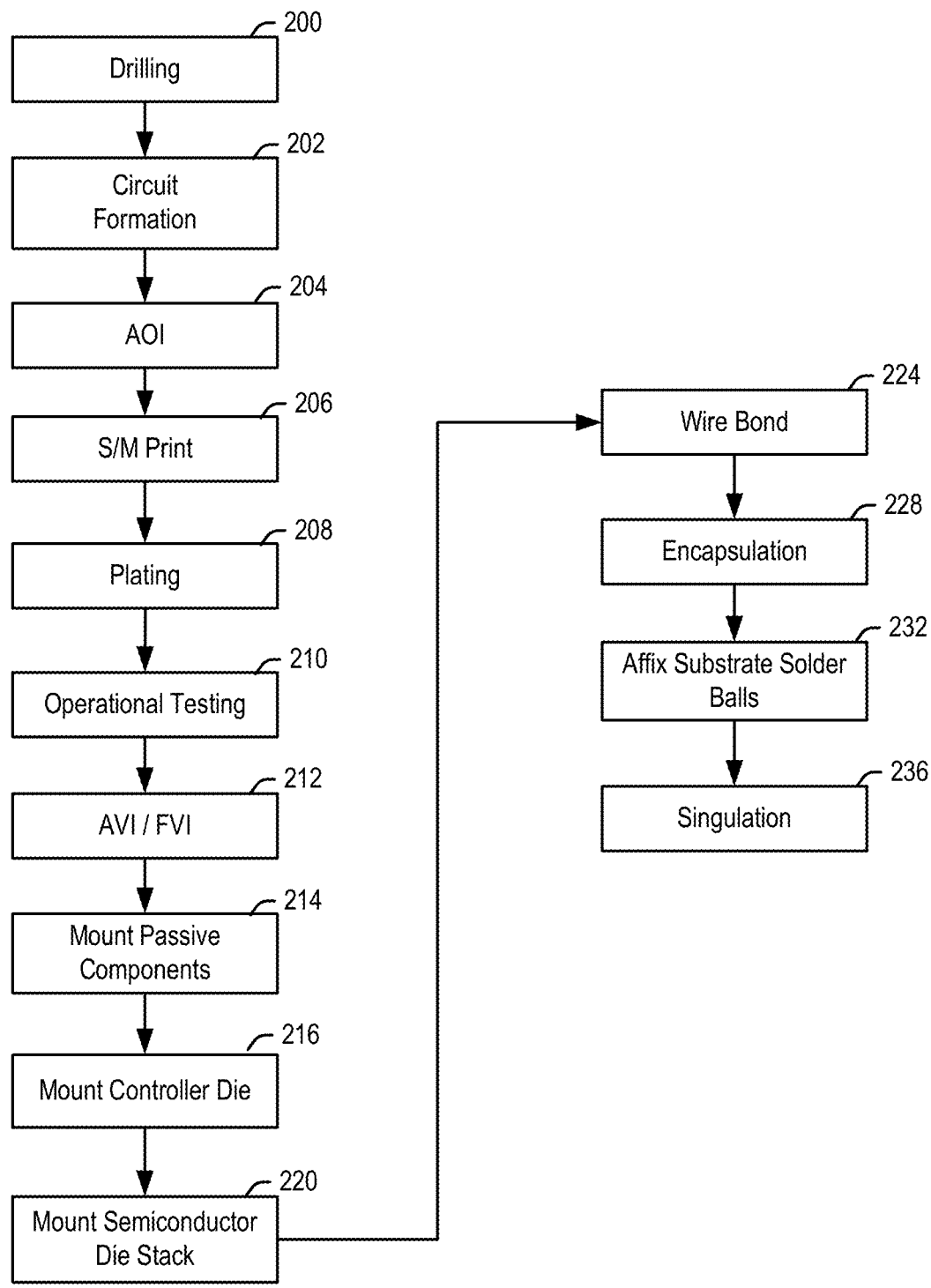
FIG. 2 is a flowchart of the overall fabrication process of semiconductor device according to embodiments of the present technology.
Figure 3:
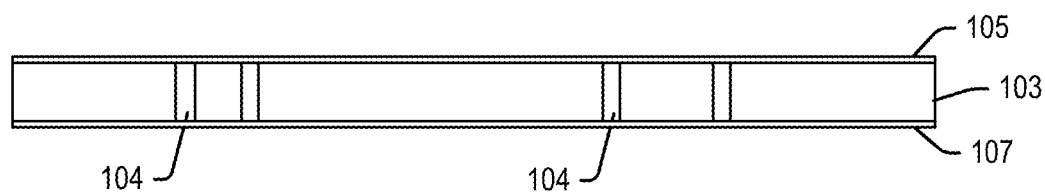
FIG. 3 is a side view of a semiconductor device at a first step in the fabrication process according to an embodiment of the present technology.

FIG. 2 is a flowchart of the fabrication process for forming a semiconductor device 100 according to embodiments of the present technology. In a step 200, the substrate 102 of a semiconductor device 100 may be drilled to define through-hole vias 104 in the substrate 102. The vias 104 are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106, contact pads 109 on a top surface of the substrate and contact pads 108 on a bottom surface of the substrate as shown for example in FIGS. 4 and 5. The traces 106 and contact pads 109, 108 (only some of which are numbered in the figures) are by way of example, and the substrate 102 may include more traces and/or contact pads than is shown in the figures, and they may be in different locations than is shown in the figures.

Figure 4:
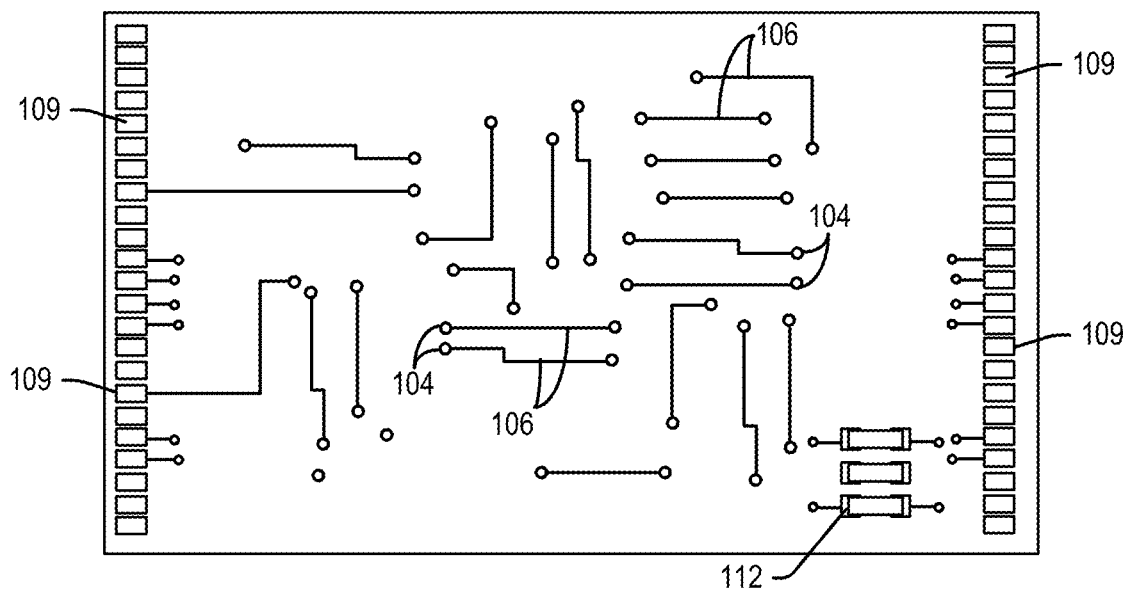
FIG. 4 is a top view of a semiconductor device at a second step in the fabrication process according to an embodiment of the present technology.
Figure 5:
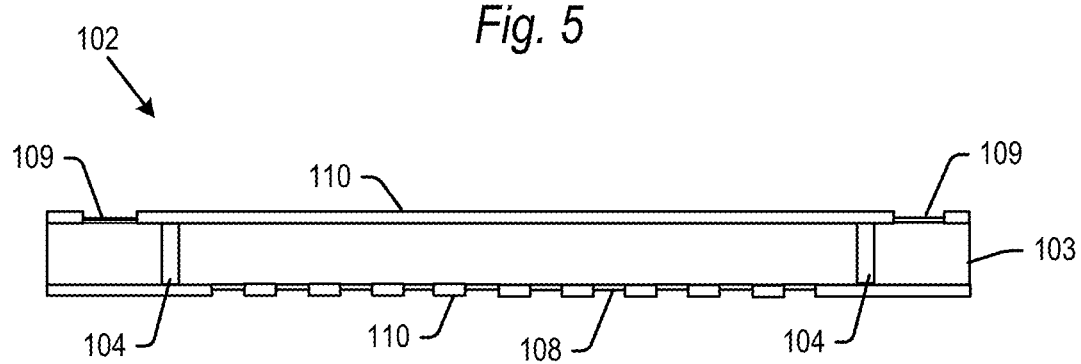
FIG. 5 is a side view of a semiconductor device at a third step in the fabrication process according to an embodiment of the present technology.

In one embodiment, the substrate 102 may include one or more rows of contact pads 109 at opposed edges of the substrate 102 as shown in FIG. 4. Further embodiments may employ a multi-layer substrate, which include internal conductance patterns in addition to those on the top and/or bottom surfaces.

In various embodiments, the finished semiconductor device may be used as a BGA (ball grid array) package. A lower surface of the substrate 102 may include contact pads 108 for receiving solder balls as explained below. In various embodiments, the finished semiconductor device 180 may be an LGA (land grid array) package including contact fingers for removably coupling the finished device 180 within a host device. In such embodiments, the lower surface may include contact fingers, instead of the contact pads that receive solder balls. The conductance pattern on the top and/or bottom surfaces of the substrate 102 may be formed by a variety of suitable processes, including for example various photolithographic processes.

Referring again to FIG. 2, the substrate 102 may next be inspected in step 204. This step may include an automatic optical inspection (AOI). Once inspected, a solder mask 110 (FIG. 5) may be applied to the substrate in step 206. After the solder mask is applied, the contact pads, and any other areas to be soldered on the conductance patterns may be plated, for example, with a Ni/Au, Alloy 42, or the like, in step 208 in a known electroplating or thin film deposition process. The substrate 102 may then undergo operational testing in step 210. In step 212, the substrate may be visually inspected, including for example an automated visual inspection (AVI) and a final visual inspection (FVI) to check for contamination, scratches and discoloration. One or more of these steps may be omitted or performed in a different order.

Assuming the substrate 102 passes inspection, passive components 112 (FIG. 4) may next be affixed to the substrate 102 in a step 214. The one or more passive components may include for example one or more capacitors, resistors and/or inductors, though other components are contemplated. The passive components 112 shown are by way of example only, and the number, type and position may vary in further embodiments.

Figure 6:
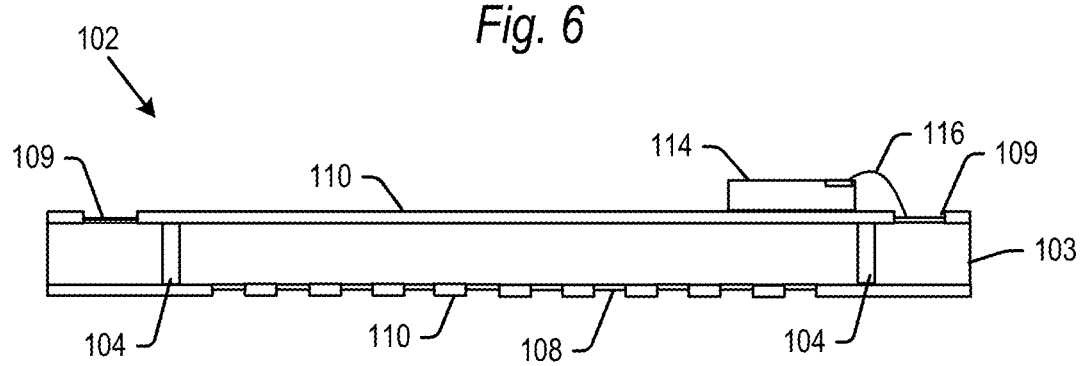
FIG. 6 is a side view of a semiconductor device at a fourth step in the fabrication process according to an embodiment of the present technology.

Referring to FIG. 6, a controller semiconductor die 114 may next be surface mounted to the substrate 102 and wire bonded using wire bonds 116 to the substrate 102 in step 216. The controller 114 may for example be an ASIC, but other controllers are contemplated. While there are advantages to mounting the controller 114 on the substrate, the controller may alternatively be mounted on top of the die stack (explained below) in further embodiments. The wire bonds shown are by way of example only, and there may be many more wire bonds 116 than are shown. While wire bonds 116 are shown off of a single side of the controller 114, there may be wire bonds off of two, three or all four sides in further embodiments.

Figure 7:
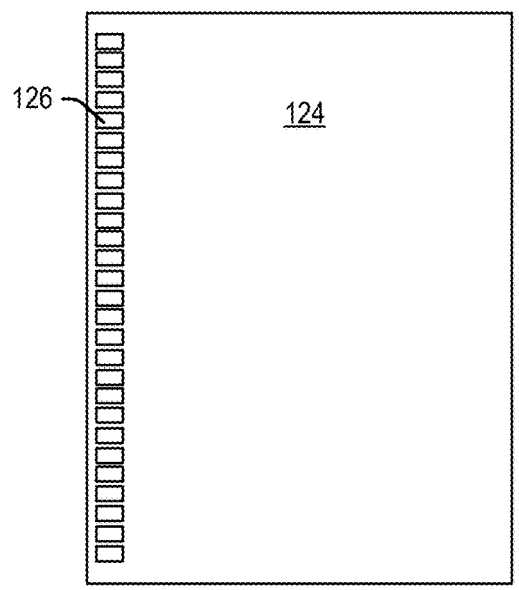
FIGS. 7 and 8 are top views of semiconductor die for use in a semiconductor device according to embodiments of the present technology.

In step 220, a semiconductor die stack may be formed on the substrate. The semiconductor die may include semiconductor die 124 shown in the top view of FIG. 7 and the semiconductor die 124t shown in the top view of FIG. 8. Semiconductor die 124 may include a set of die bond pads 126 along a first edge of the semiconductor die 124. These die bond pads are used to electrically interconnect the semiconductor die to each other and the substrate for signal transfer to and from the semiconductor die. In particular, the semiconductor die 124 may be formed by processing steps defining integrated circuits (not shown) within the die 124, and metallization steps depositing metal layers including the die bond pads 126 and metal interconnect layers and vias for electrically connecting the integrated circuits with the die bond pads 126. The die bond pads 126 may also be referred to herein as signal transfer bond pads 126. Each die 124, 124t may include many more die bond pads 126 than is shown in FIG. 7.

Semiconductor die 124t may be identical to semiconductor die 124, except that die 124t includes a second set of die bond pads, referred to herein as dummy die bond pads 128. In embodiments, the dummy die bond pads 128 are distinguishable from signal transfer bond pads 126 in that dummy die bond pads 128 are not electrically connected to the integrated circuits within the die 124t. In further embodiments, the dummy die bond pads 128 may be connected to the integrated circuits within die 124t, but the dummy die bond pads 128 are not used to transfer signals to or from the integrated circuits within the semiconductor die 124t.

Figure 8:
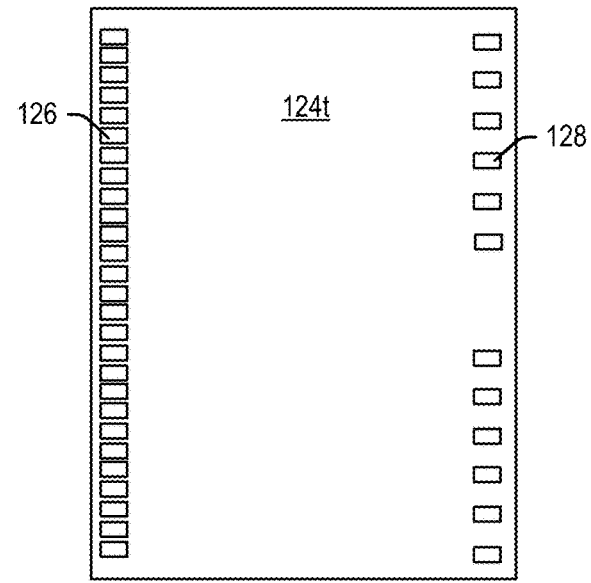

As with die 124, die 124t may also include signal transfer bond pads 126 on the first edge of the die 124t which transfer signals to and from the integrated circuits within the die 124t. The dummy die bond pads 128 may be provided along a second edge of the die 124t opposed to the first edge including signal transfer bond pads 126. As explained below, die 124t may include more or less die bond pads 128 than is shown in FIG. 8.

Figure 9:
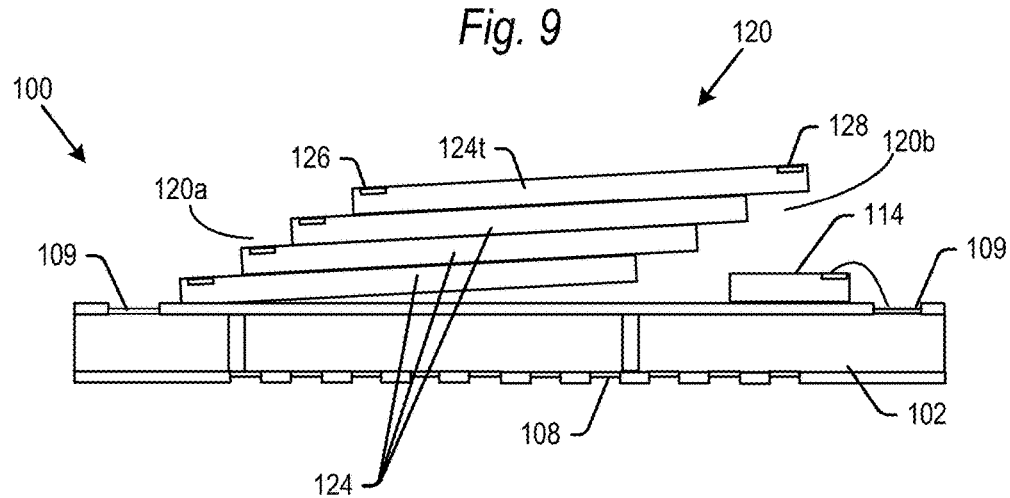
FIG. 9 is a side view of a semiconductor device at a fifth step in the fabrication process according to an embodiment of the present technology.

Referring to FIG. 9, a number of semiconductor die 124, 124t may be stacked on the substrate 102 in step 220 to form die stack 120. In embodiments, the die stack may include a single die 124t, which may be the top-most semiconductor die in stack 120. The remaining semiconductor die may be die 124 (without the dummy die bond pads 128). However, in further embodiments, the die stack may include more than one die 124t. In one such further embodiment, the die stack 120 may include all die 124t and no die 124.

The semiconductor die 124, 124t may for example be memory die such a 2D or 3D NAND flash memory die, but other types of semiconductor die may be used. These other types of semiconductor die include but are not limited to controller die such as an ASIC, or RAM such as an SDRAM. Where multiple semiconductor die are included, the semiconductor die may be stacked atop each other in an offset stepped configuration to form a die stack 120. The example illustrated in the figures includes four semiconductor die 124, 124t, but embodiments may include different numbers of semiconductor die, including for example 1, 2, 4, 8, 16, 32 or 64 die. There may be other numbers of die in further embodiments. The die may be affixed to the substrate and/or each other using a die attach film (DAF) layer. As one example, the die attach film may be 8988UV epoxy from Henkel AG & Co. KGaA, cured to a B-stage to preliminarily affix the die 124, 124t in the stack 120, and subsequently cured to a final C-stage to permanently affix the die 124, 124t in the stack 120.

Die stack 120 may include a first edge 120a (adjacent die bond pads 126) and a second edge 120b (adjacent die bond pads 128). As shown in FIG. 9 and discussed in the Background section, after the die stack 120 is formed on the substrate, forces may act on the die stack which overcome the adhesive forces of the DAF layer on the bottommost die so that the edge 120b of the die stack 120 tilts off of the substrate as shown in FIG. 9. This issue is corrected in accordance with the present technology during a wire bonding step as explained below.

Figure 10:
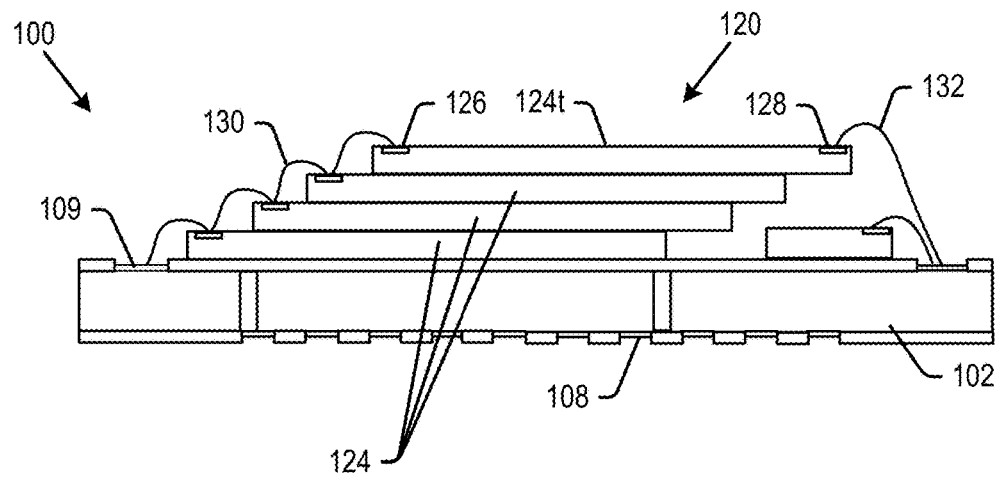
FIG. 10 is a side view of a semiconductor device at a sixth step in the fabrication process according to an embodiment of the present technology.
Figure 11:
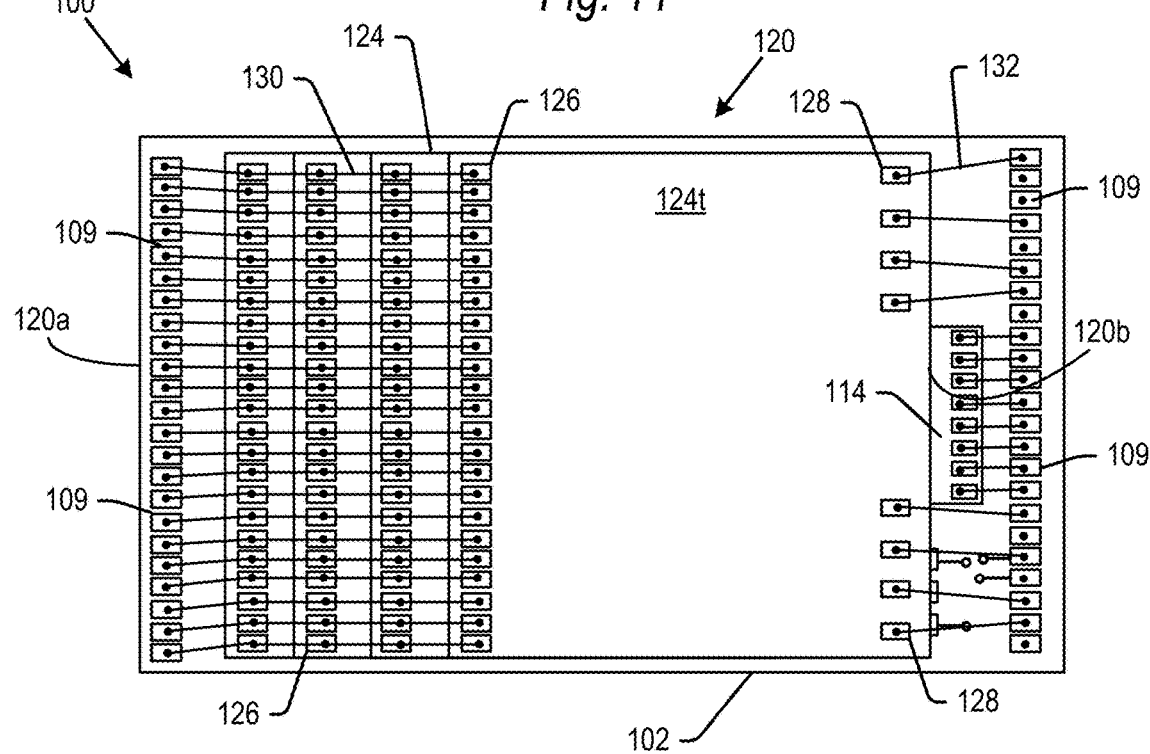
FIG. 11 is a top view of the semiconductor device shown in FIG. 10.

In step 224, two sets of wire bonds may be formed on the die 124, 124t in stack 120. As shown in FIGS. 10 and 11, a first set of wire bonds, wire bonds 130, may be formed down a first edge of the die stack 120, between aligned die bond pads 126 on respective die 124, 124t. Wire bonds 130 may also be used to electrically connect the die stack 120 to the contact pads 109 on substrate 102. Wire bonds may be used to electrically connect the aligned die bond pads 126 to each other and substrate 102, thus allowing signal transfer between the substrate and the semiconductor die 124, 124t in stack 120. The wire bonds 130 may also be referred to herein as signal transfer wire bonds 130.

In one embodiment, the wire bonds 130 may be formed as ball bonds, though other types of bonds are contemplated. The wire bonds 130 may be formed of gold, gold alloy or other materials. The wire bonds 130 are shown generally in a straight vertical column from one layer of die to the next in the die stack 120, and to the substrate 102. However, one or more of the wire bonds may extend diagonally from one die to the next in alternative embodiments. Further, it may be that a wire bond skips one or more layers in the die stack 120.

In step 224, a second set of wire bonds may also be formed between the die 124t and the substrate 102. As shown in FIGS. 10 and 11, the second set of wire bonds, wire bonds 132, may be formed between dummy die bond pads 128 and contact pads 109 on substrate 102. In embodiments, wire bonds 132 do not carry signals between die bond pads 128 and contact pads 109, and as such, may at times be referred to herein as dummy wire bonds 132. In accordance with aspects of the present technology, wire bonds 132 are provided for the purpose of pulling the die stack down flat against the substrate and holding it in that position.

In particular, each wire bond formed between dummy die bond pads 128 and contact pads 109 exerts a force on second edge of the die stack to pull down the die stack and/or hold it flat against the substrate 102. The force exerted by each dummy wire bond is due to the stiffness of the wire used for the dummy wire bond. The stiffness may be a factor of the wire diameter, Young's modulus of the wire and/or the geometric stiffness (i.e., stiffness due to the shape of the wire bond). In one example, each dummy wire bond 132 can exert between 12 and 25 grams of force on a die pad though these values may vary in further examples, depending in part on the type of bond used, thickness and stiffness of the wire, type of wire used, etc.

In one embodiment, the dummy wire bonds 132 may be formed of gold, copper or aluminum, or alloys thereof, though other materials may be used in further embodiments. The dummy wire bonds 132 may have a diameter of 0.6 mils, 0.7 mils or 0.8 mils, though the diameter of the wire bonds 132 may vary above or below these values in further embodiments. The dummy wire bonds 132 may be formed of the same material and same diameter as the signal transfer wire bonds 130, though the material and/or thickness of the dummy wire bonds 132 may be different than that of the signal transfer wire bonds 130 in further embodiments.

Sample values for properties of dummy wire bonds 132 formed of different materials are provided in table 1 below. These property values are provided by way of example only and may vary in embodiments.

and configuration of dummy wire bonds 132 may vary in embodiments, with the understanding that the number and configuration of dummy wire bonds 132 may be sufficient to hold the second edge 120b of the die stack 120 down against the substrate 102. In embodiments, there may be less dummy bond pads 128 than there are signal transfer bond pads, and there may be less dummy wire bonds 132 than there are signal transfer wire bonds 130. However, in further embodiments, there may be equal numbers of dummy bond pads 128 and signal transfer bond pads 126, and there may be equal numbers of dummy wire bonds 132 and signal transfer wire bonds 130.

As shown in FIG. 11, the area on the semiconductor die 124t adjacent the controller die 114 may be left devoid of dummy bond pads 128 and dummy wire bonds 132, though dummy bond pads 128 and dummy wire bonds 132 may be provided in the area of the controller die 114 in further embodiments.

Figure 12:
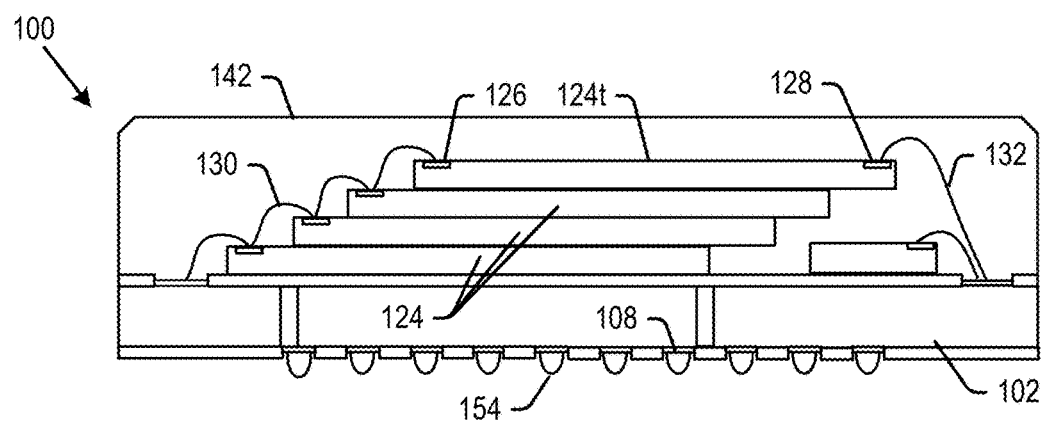
FIG. 12 is a side view of a completed semiconductor device according to an embodiment of the present technology.

Following electrical connection of the die stack 120 and the formation of the dummy wire bonds, the semiconductor device 100 may be encapsulated in a mold compound 142 in a step 228 and as shown in FIG. 12. Mold compound 142 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied by a FFT (Flow Free Thin) process or by other known processes, including by transfer molding or injection molding techniques.

In accordance with aspects of the present technology, the dummy wire bonds pull down and hold the die stack 120 flat against the substrate. Accordingly, the problem of an edge of a semiconductor die in a tilted die stack extending through a surface of mold compound 142 is alleviated. As a further benefit, manufacturers of semiconductor device 100 need not maintain and keep that area on a surface of the mold compound 142 where printing is prohibited, and manufacturers are free to print anywhere on the surface of the mold compound.

In step 232, solder balls 154 (FIG. 11) may be affixed to the contact pads 108 on a lower surface of substrate 102 of the device 100. The solder balls 154 may be used to affix the semiconductor device 100 to a host device (not shown) such as a printed circuit board. Solder balls 154 may be omitted where the semiconductor device 100 is to be used as an LGA package.

TABLE 1

|  | Gold wire bond | Copper Wire bond | Aluminum wire bond |
| --- | --- | --- | --- |
| Vickers Hardness: | 216 MN/m$^2$ | 369 MN/m$^2$ | 167 MN/m$^2$ |
| Youngs Modulus: | 78 GPa | 130 GPa | 70 GPa |
| Modulus of Elasticity: | 79 GPa | 123 GPa | 71 GPa |
| Tensile Strength: | 120-220 N/mm$^2$ | 210-370 N/mm$^2$ | 100-200 N/mm$^2$ |

In one embodiment, the wire bonds 132 may be formed as ball bonds, though other types of bonds are contemplated. During formation using a wire bond capillary, the capillary may form a ball on pads 128, using pressure and heat. This pressure may also aid in flattening the second edge of the die stack against the substrate 102.

FIG. 11 shows a particular number and configuration of dummy wire bonds 132, but it is understood that the number As noted above, the semiconductor device 100 may be formed on a panel of substrates. After formation and encapsulation of the devices 100 on the panel, the devices 100 may be singulated from each other in step 236 to form a finished semiconductor device 100 as shown in FIG. 12. The semiconductor devices 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 100, it is understood that semiconductor device 100 may have shapes other than rectangular and square in further embodiments of the present technology.

Figure 13:
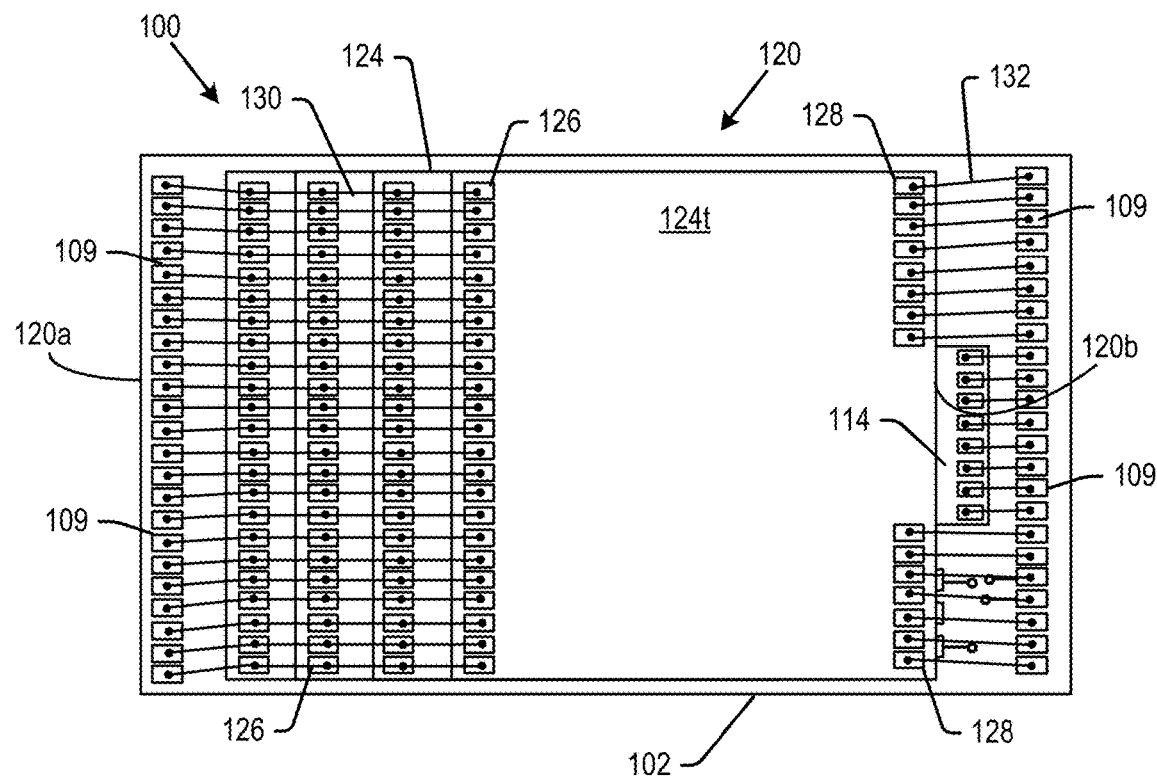
FIGS. 13-19 are top and side views of alternative embodiments of the present technology.

As noted, the particular configuration of dummy bond pads 128 and dummy wire bonds 132 shown in the top view of FIG. 11 is by way of example only and may vary in further embodiments. FIG. 13 is a top view of one further configuration of dummy bond pads 128 and dummy wire bonds 132 showing a higher concentration of dummy bond pads 128 and dummy wire bonds 132 than in FIG. 11. With the exception of the central area of the controller 114, the dummy bond pads 128 and dummy wire bonds 132 may be in the same concentration as the signal transfer bond pads 126 and signal transfer wire bonds 130 on the first side 120a of the die stacks 120.

Figure 14:
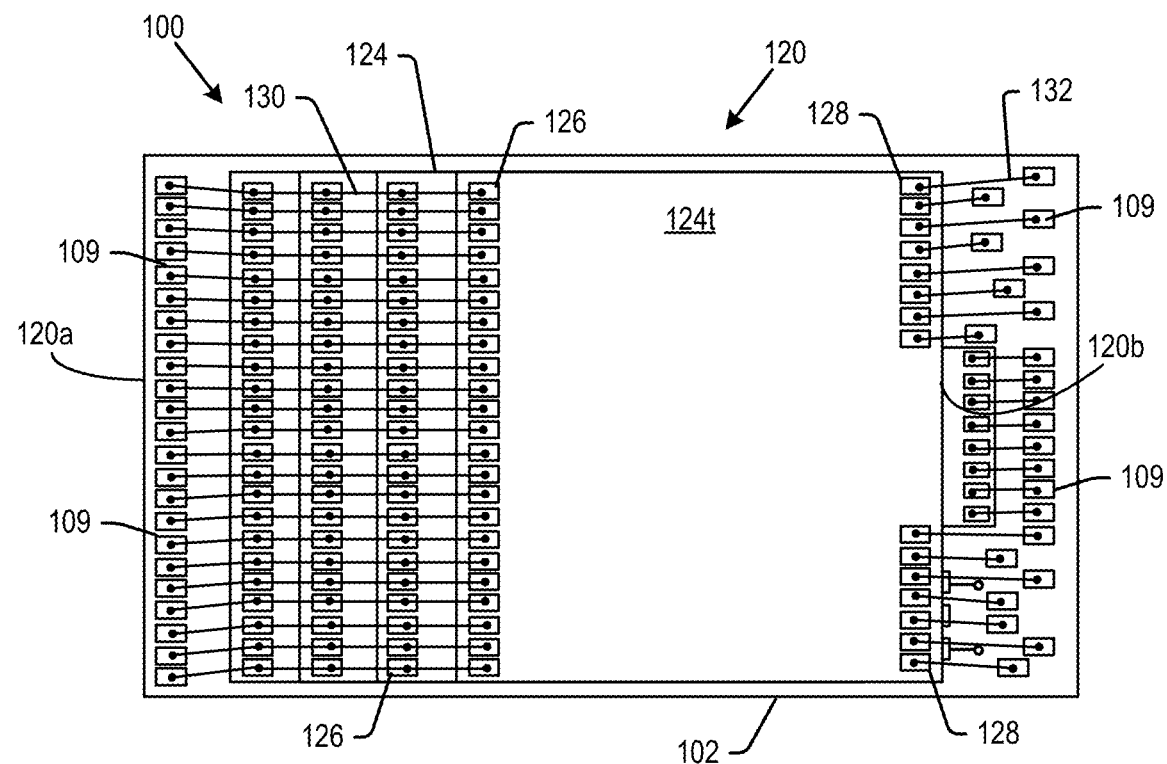

FIG. 14 is a top view of a further configuration of dummy bond pads 128 and dummy wire bonds 132. In this embodiments, the substrate 102 includes multiple rows and positions of contact pads 109 which receive the dummy wire bonds 132. Varying the positions of the contact pads 109 allows for a large number of dummy bond pads 128 and dummy wire bonds 132, and allows the lengths of the dummy wire bonds 132 to vary.

Figure 15:
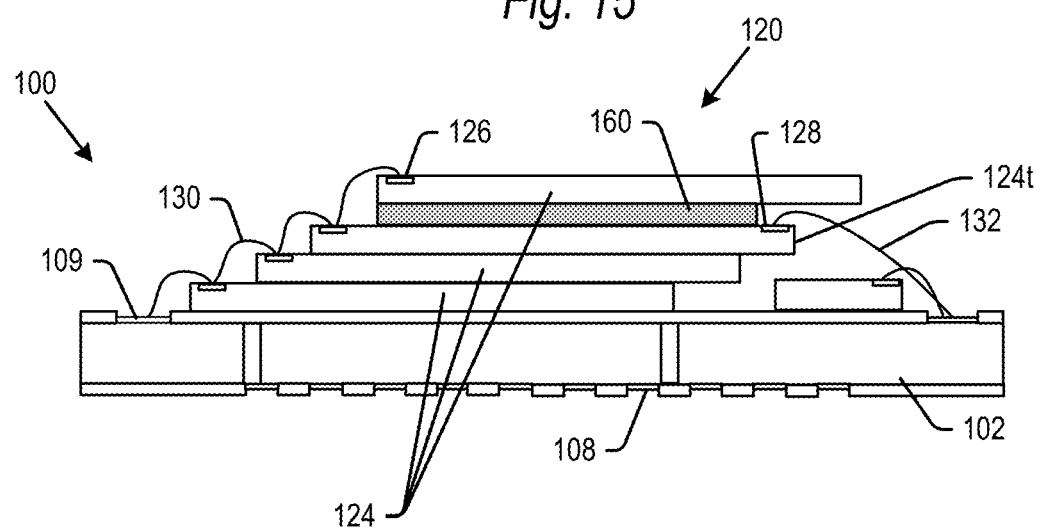

In embodiments, the semiconductor die 124t including the dummy bond pads 128 is the topmost semiconductor die in stack 120. However, in further embodiments, it need not be. FIG. 15 is a side view showing an embodiment where the semiconductor die 124t is not the top die. In this embodiment, it is the third die in the stack 120, and the topmost semiconductor die is a die 124. In this embodiment, in order to make space for the dummy wire bond 132 beneath the top die 124, a film layer 160 may be provided between the die 124t and the topmost die 124. A silicon spacer may be used instead of film layer 160. The semiconductor die 124t may be lower in the stack 120 in further embodiments.

Figure 16:
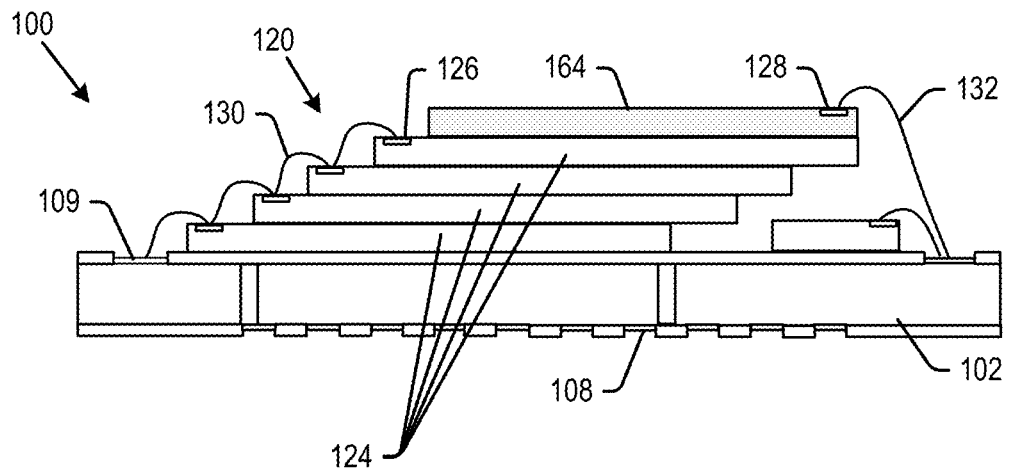

In embodiments described above, the semiconductor die 124t including the dummy bond pad 128 is a functioning semiconductor die, such as for example a flash memory die, like the other die 124. In a further embodiment, the component including the dummy bond pad 128 need not be a functioning semiconductor die. For example, as shown in FIG. 16, the die stack 120 may include a number of functioning semiconductor die 124 (four shown in this example, but could be more or less). A dummy die 164 is mounted on the die stack 120. Dummy die 164 may be made of silicon or other material, but need not be a functioning semiconductor die. For example, dummy die 164 need not have any integrated circuits. Dummy die 164 does include the dummy die bond pads 128, and the dummy wire bonds 132 are formed between the dummy die bond pads 128 and the substrate 102 in accordance with any of the above-described embodiments.

Figure 17:
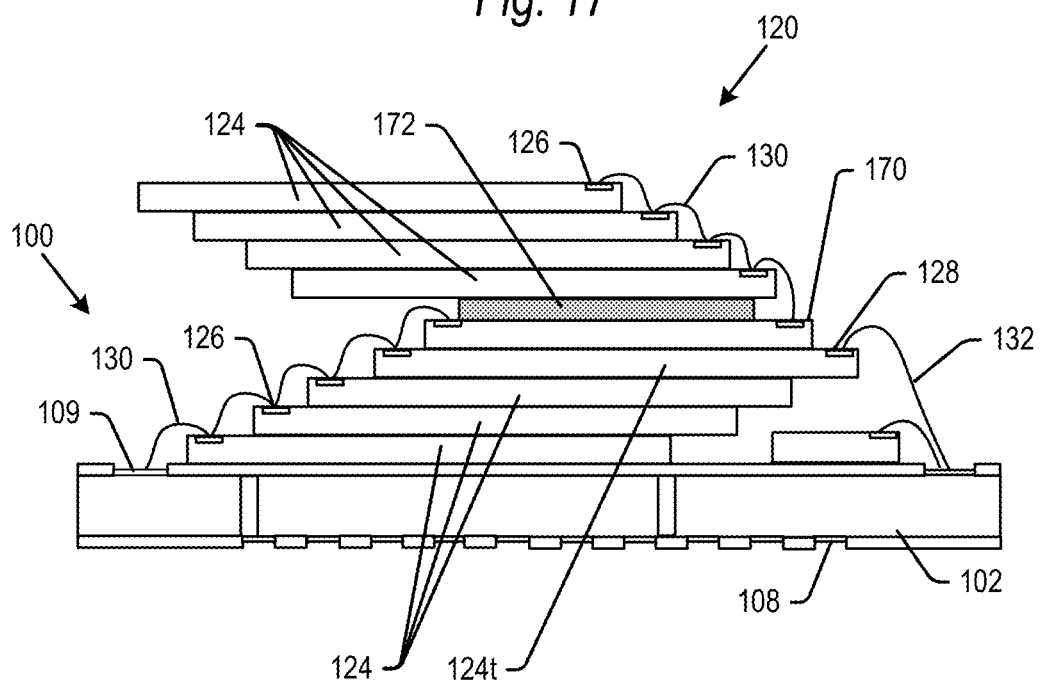

In the embodiments described above, the die stack 120 is offset stepped in a single direction. FIG. 17 shows a further alternative embodiment, where the die stack 120 includes a first group of semiconductor die offset in a first stepped direction and a second group of semiconductor die offset in a second stepped direction opposite the first stepped direction. The first group of semiconductor die include die 124 and die 124t (shown as the top semiconductor die in the first group of die). While the first and second groups of semiconductor die are shown as including four semiconductor die each, there may be fewer or greater than four die in the first and/or second groups.

An interposer layer 170 may be affixed on top of the semiconductor die 124t. As is known, the interposer layer 170 includes signal transfer bond pads 126 on opposed sides of the interposer, and a redistribution pattern of electrical traces extending between them. These signal transfer bond pads and redistribution pattern traces may be used to transfer signals from the semiconductor die 124 in the second group of semiconductor die to the first group of semiconductor die, and from there, to the substrate, and vice-versa. In order to allow the first group of semiconductor die to wire bond to the interposer layer 170, a film layer 172 may be provided between the interposer layer 170 and the first semiconductor die in the second group of semiconductor die. A silicon spacer may be used instead of film layer 172.

Dummy wire bonds 132 may be formed between the semiconductor die 124t and the substrate 102 as described in any of the preceding embodiments. As explained above, the dummy wire bonds may effectively pull-down and hold the die stack 120 flat against the substrate.

Figure 18:
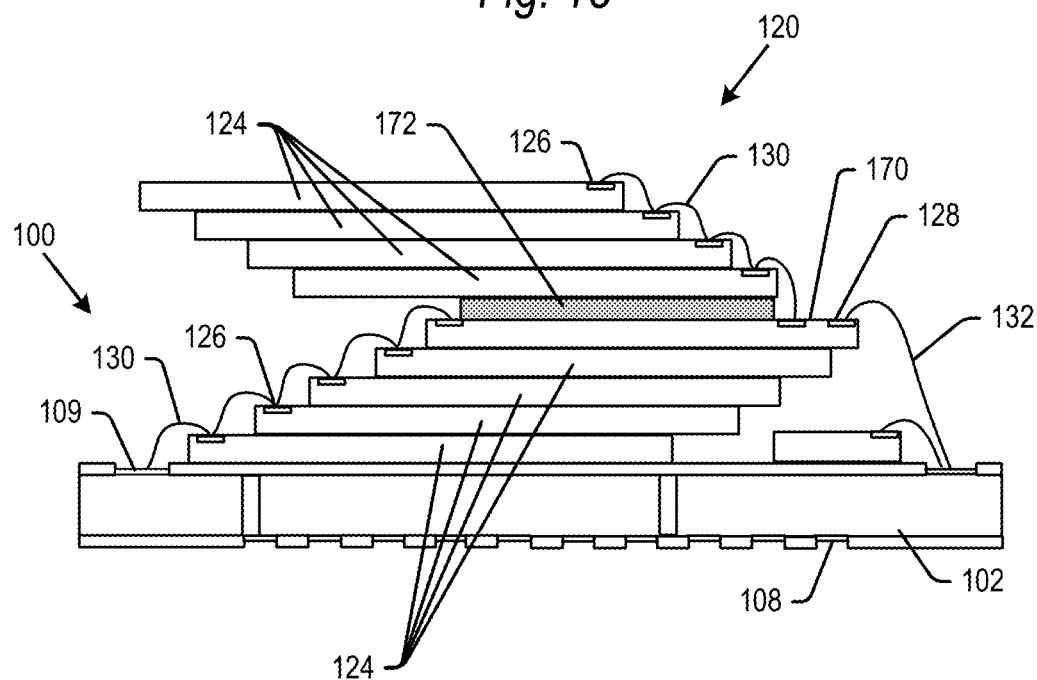

FIG. 18 shows a further embodiment of the present technology. The embodiment of FIG. 18 is similar to that of FIG. 17. However, in this embodiment, the top die in the first group of semiconductor die does not include the dummy bond pads 128. The top die may be identical to the other die in the die stack. In this embodiment, the dummy bond pads 128 may be moved to the interposer layer 170. As shown, the interposer layer may include signal transfer die bond pads 126 on opposed sides of the interposer layer that are used to transfer signals between the first and second groups of semiconductor die as explained above. The interposer may also include the dummy bond pads 128 as shown along one edge. Dummy wire bonds 132 may be formed between the dummy bond pads 128 on the interposer layer 170 and the substrate 102 as described in any of the preceding embodiments. As explained above, the dummy wire bonds may effectively pull-down and hold the die stack 120 flat against the substrate.

Figure 19:
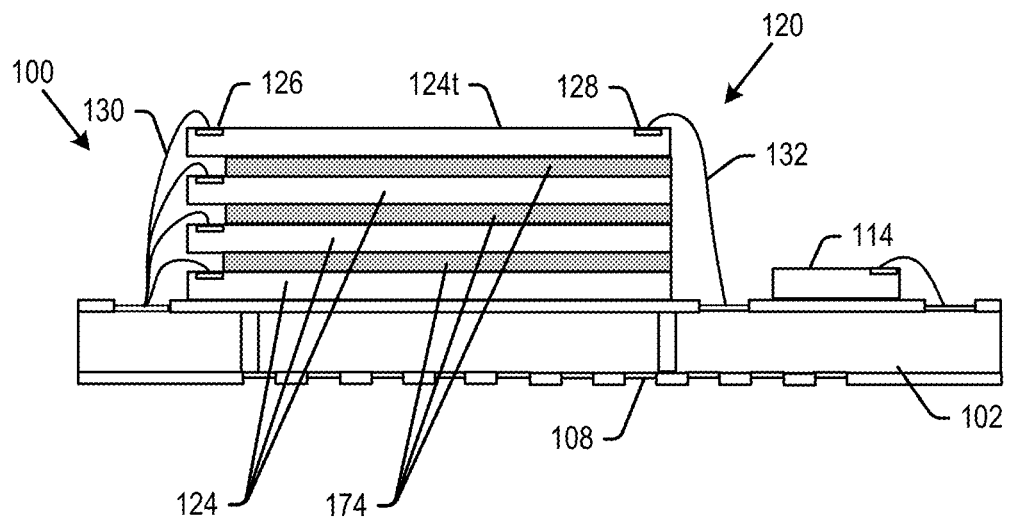

In the embodiments described above, the die stack 120 which provided in an offset, stepped configuration, providing access to the signal transfer die bond pads for wire bonding. In further embodiments, the die stack 120 need not be offset or stepped. For example, as shown in FIG. 19, the die stack 120 may include semiconductor die 124, 124t stacked directly on top of each other. The semiconductor die 124, 124t may be spaced from each other with a film or spacer layer 174 to allow access to the signal transfer bond pads 126 for signal transfer wire bonds 130. Instead of being connected to the next adjacent semiconductor die, the wire bonds 130 in this embodiment may extend from the signal transfer bond pads 126 on each semiconductor die directly to the substrate 102.

As described above, the die stack 120 may include a semiconductor die 124t with dummy bond pads 128 which hit wire bonded to the substrate 102 via dummy wire bonds 132. The dummy wire bonds 132 may extend over the controller die 114 on the substrate 102 as shown for example in FIGS. 10 and 12. Alternatively, as shown in FIG. 19, the dummy wire bonds 132 may connect to contact pads placed on the substrate between the die stack 120 and the controller die 114. In further embodiments, some of the dummy wire bonds 132 may extend of the controller die 114 (as in FIGS. 10 and 12) and some may connect to contact pads between the die stack 120 and a controller die 114 (as in FIG. 19).

FIG. 19 shows semiconductor die 124, 124t wire bonded to the substrate with signal transfer bond pads 126 and wire bonds 130. However, in further embodiments, the semiconductor die 124, 124t may be electrically coupled to the substrate 102 by other electrical interconnection schemes. In one such scheme, the semiconductor die 124, 124t may be electrically coupled to the substrate 102 using through silicon vias (TSV).

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
a substrate including a set of contact pads;
one or more semiconductor die mounted on the substrate and electrically coupled to the substrate, at least one semiconductor die of the one or more semiconductor die comprising a set of bond pads; and
a set of wire bonds connected between the set of bond pads on the at least one semiconductor die and the set of contact pads on the substrate, the set of wire bonds configured to exert a force on the one or more semiconductor die to hold the one or more semiconductor die down on the substrate.

2. The semiconductor device of claim 1, wherein the one or more semiconductor die comprise a plurality of stacked semiconductor die, and wherein the at least one semiconductor die comprises a topmost semiconductor die in the plurality of stacked semiconductor die.

3. The semiconductor device of claim 1, wherein the set of wire bonds comprise a first set of wire bonds, and wherein the one or more semiconductor die are electrically coupled to the substrate by a second set of wire bonds different than the first set of wire bonds.

4. The semiconductor device of claim 3, wherein there are more wire bonds in the second set of wire bonds than there are in the first set of wire bonds.

5. The semiconductor device of claim 1, wherein the set of contact pads on the substrate are aligned in a single row.

6. The semiconductor device of claim 5, wherein the single row of contact pads are adjacent an edge of the substrate.

7. The semiconductor device of claim 1, wherein the set of contact pads on the substrate are aligned in two or more rows.

8. The semiconductor device of claim 1, wherein the set of die bond pads comprise a set of dummy bond pads, and wherein the one or more semiconductor die comprise a plurality of semiconductor die stacked in an offset stepped arrangement, the semiconductor device further comprising a set of signal transfer bond pads on a portion of each semiconductor die exposed by the offset stepped arrangement.

9. The semiconductor device of claim 8, wherein the set of wire bonds comprise a set of dummy wire bonds, the semiconductor device further comprising a set of signal transfer wire bonds coupled to the signal transfer bond pads of the plurality of semiconductor die.

10. The semiconductor device of claim 9, wherein the set of contact pads on the substrate comprise a first set of contact pads, the semiconductor device further comprising a second set of contact pads electrically coupled to the signal transfer bond pads by the signal transfer wire bonds.

11. The semiconductor device of claim 8, further comprising a controller die mounted on the substrate beneath one or more of the plurality of semiconductor die stacked in the offset stepped arrangement.

12. The semiconductor device of claim 1, wherein the one or more semiconductor die comprise a plurality of semiconductor die stacked in an offset stepped arrangement, and the at least one semiconductor die comprises a topmost semiconductor die on the stack, the semiconductor device further comprising a controller die mounted on the substrate beneath the topmost semiconductor die in the stack.

13. The semiconductor device of claim 12, wherein an area of the topmost semiconductor die above the controller die is devoid of bond pads.

14. A semiconductor device, comprising:
a substrate including a first set of contact pads and a second set of contact pads;
one or more semiconductor die mounted on the substrate, at least one semiconductor die of the one or more semiconductor die comprising a first set of bond pads and a second set of bond pads;
a first set of wire bonds electrically connecting the first set of bond pads on the at least one semiconductor die to the first set of contact pads on the substrate, the first set of wire bonds configured to transfer signals between the first set of bond pads and the first set of contact pads; and
a second set of wire bonds connected between the second set of bond pads on the at least one semiconductor die and the second set of contact pads on the substrate, the second set of wire bonds configured to exert a force on the one or more semiconductor die to hold the one or more semiconductor die down on the substrate.

15. The semiconductor device of claim 14, wherein the first set of wire bonds extend off a first edge of the at least one semiconductor die, and the second set of wire bonds extend off a second, opposed edge of the at least one semiconductor die.

16. The semiconductor device of claim 14, wherein the one or more semiconductor die comprise a plurality of offset stacked semiconductor die stepped in a first direction.

17. The semiconductor device of claim 16, wherein the at least one semiconductor die is a topmost semiconductor die in the stack.

18. The semiconductor device of claim 16, wherein the plurality of semiconductor die comprise a first plurality of semiconductor die, and wherein the one or more semiconductor die comprise a second plurality of offset stacked semiconductor die stepped in a second direction opposite to the first direction.

19. The semiconductor device of claim 18, wherein the at least one semiconductor die is positioned between the first and second pluralities of semiconductor die.

20. A semiconductor device, comprising:
a substrate including a first set of contact pads and a second set of contact pads;
a plurality of semiconductor die stacked on the substrate in an offset stepped arrangement;
a component mounted on top of the plurality of semiconductor die;
a set of dummy bond pads formed along an edge of the component;

a set of signal transfer wire bonds configured to electrically connect the plurality of semiconductor die with each other and the first set of contact pads on the substrate; and a set of dummy wire bonds connected between the set of dummy bond pads and the second set of contact pads on the substrate, the set of dummy wire bonds configured to exert a force on the plurality of semiconductor die to hold the plurality of semiconductor die down on the substrate.

21. The semiconductor device of claim 20, wherein the component is devoid of integrated circuits.

22. The semiconductor device of claim 20, wherein the component comprises a semiconductor die comprising integrated circuits.

23. The semiconductor device of claim 22, wherein the component further comprises a set of signal transfer bond pads along an edge of the component opposed to the edge including the set of dummy bond pads.

24. The semiconductor device of claim 23, wherein the component is electrically coupled to the substrate via the set of signal transfer wire bonds connected to the set of signal transfer bond pads.

\* \* \* \* \*